United States Patent [19]

Karasawa

[11] Patent Number: 4,985,676
[45] Date of Patent: Jan. 15, 1991

[54] METHOD AND APPARATUS OF PERFORMING PROBING TEST FOR ELECTRICALLY AND SEQUENTIALLY TESTING SEMICONDUCTOR DEVICE PATTERNS

[75] Inventor: Wataru Karasawa, Yokohama, Japan

[73] Assignee: Tokyo Electron Limited, Tokyo, Japan

[21] Appl. No.: 312,045

[22] Filed: Feb. 17, 1989

[51] Int. Cl.$^5$ ............................................. G01R 31/02
[52] U.S. Cl. ................................. 324/158 R; 324/73.1
[58] Field of Search ............. 324/73 R, 158 R, 158 F, 324/73 AT; 331/20, 25

[56] References Cited

U.S. PATENT DOCUMENTS

| | | | |
|---|---|---|---|
| 4,590,422 | 5/1986 | Milligan | 324/158 P |
| 4,677,474 | 6/1987 | Sato et al. | 324/158 P |
| 4,786,867 | 11/1988 | Yamatsu | 324/158 F |

FOREIGN PATENT DOCUMENTS 60-134433  7/1985  Japan .
61-176130  8/1986  Japan .

Primary Examiner—Reinhard J. Eisenzopf
Assistant Examiner—Edward Urban
Attorney, Agent, or Firm—Oblon, Spivak, McClelland, Maier & Neustadt

[57] ABSTRACT

This invention relates to a method and apparatus for performing a probing test for sequentially testing chips formed on a semiconductor wafer in a matrix form. An area of a chip subjected to the test or a chip excluded from the test on the wafer is preset, the preset-area information is stored, and only chips subjected to to the test are tested on the basis of the sequentially readout preset-area information.

6 Claims, 5 Drawing Sheets

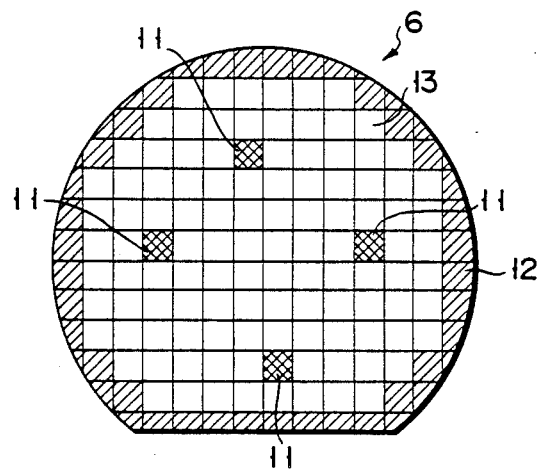
F I G. 8
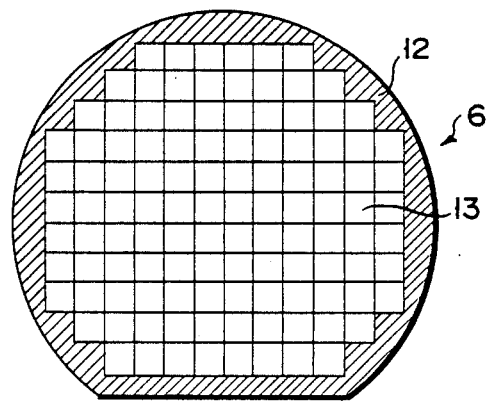
F I G. 9

METHOD AND APPARATUS OF PERFORMING PROBING TEST FOR ELECTRICALLY AND SEQUENTIALLY TESTING SEMICONDUCTOR DEVICE PATTERNS

BACKGROUND OF THE INVENTION

1. Field of the Invention

The present invention relates to a method and apparatus for performing a probing test for electrically testing chips such as ICs formed in a semiconductor wafer and, more particularly, to a method and apparatus for properly testing a chip of interest with high efficiency.

2. Description of the Related Art

Semiconductor devices such as ICs and LSIs must be tested during the manufacturing process several times so as to evaluate their electrical characteristics. A wafer test process is performed between a wafer forming process and an assembly process. That is, the wafer test process is performed in units of device patterns after preprocesses such as pattern etching and protective film coating.

A wafer test system basically includes a wafer probing machine (also called a wafer prober) and a tester. These components are connected via a measuring line. A test complete signal and a test fail signal are exchanged between the wafer probing machine and the tester in response to a test start signal on a test control line.

This wafer probing machine comprises an X-Y table movable along the X- and Y-axes, a wafer-setting stage equipped on the X-Y table, and a probe card having a large number of probes which are brought into contact with electrodes of each chip in the semiconductor wafer placed on the wafer-setting stage.

In a probing test, when a test of a given chip is completed, the wafer-setting stage is moved in the Z-axes, the X-Y table is moved in the X- and Y-axes, and the next chip is tested. In this manner, a large number of chips arranged on the wafer in a matrix form are tested in units of rows. Chips which are discriminated as defective chips are marked with an ink or the like.

As shown in FIG. 1, a large number of chips 3 are arranged in semiconductor wafer 1 in a matrix form. In the matrix of chips 3, a direction parallel to orientation flat 1a of wafer 1 defines "rows", and a direction perpendicular to orientation flat 1a defines "columns". Since wafer 1 is almost circular, omissions occur in chips 2 in the peripheral area of the wafer, and these chips are detected as defective chips. For this reason, chips 2 in the peripheral area of the wafer are eliminated from chips subjected to the test from the beginning, and a test time is shortened.

An edge-correction method is used as a conventional means for eliminating defective chips 2 in the peripheral area of the wafer from chips subjected to the test.

According to the edge-correction method, when a total area of each chip 3 to be formed in semiconductor wafer 1 is given as 100%, a numeric value is preset as a parameter for determining a percentage of chip area subjected to the test to determine whether a chip of interest is excluded from chips subjected to the test on the basis of the above numeric value.

Assume that a parameter value of edge-correction is set to be 50%. In this case, when the area of a chip in the peripheral area of the wafer is less than 50% of the total area of nondefective chip 3, this peripheral chip is excluded from chips subjected to the test.

A calculation technique of edge-correction will be described below.

When a semiconductor wafer is placed on a wafer carrier in a probing test machine and is positioned thereon, the diameter and central position of the wafer are measured. An edge-correction value of each chip is calculated on the basis of the measured values.

As shown in FIG. 2, central point O of semiconductor wafer 1 is given as an origin, and X-Y coordinates (a,c), (a,d), (b,d), and (b,c) of four corner points A, B, C, and D are measured. Distances between central point O and four points A, B, C, and D are calculated. The calculated distances are compared with radius R of the semiconductor wafer to determine whether each chip is perfectly formed on wafer 1. For example, for chip 2 in FIG. 2:

| | |
|---|---|
| $R^2 > a^2 + c^2$ | Point A: on wafer |
| $R^2 > a^2 + d^2$ | Point B: on wafer |
| $R^2 < b^2 + d^2$ | Point C: off wafer |
| $R^2 < b^2 + c^2$ | Point D: off wafer | and this chip 2 is determined to be located in the peripheral portion of wafer 1 and to be a chip with an omission.

However, for chip 3 in FIG. 2:

| | |
|---|---|
| $R^2 > a^2 + c^2$ | Point A: on wafer |
| $R^2 > a^2 + d^2$ | Point B: on wafer |
| $R^2 > b^2 + d^2$ | Point C: on wafer |
| $R^2 > b^2 + c^2$ | Point D: on wafer | and this chip 3 is determined to be a nondefective chip without any omission.

When above-mentioned chip 2 is determined to be a chip with an omission, the area of chip 2 is calculated and compared with the area of nondefective chip 3 to obtain an area ratio. The calculated area ratio is compared with the preset edge-correction parameter value to determine whether chip 2 can be a chip subjected to the test or not.

Conventional probing test procedures will be described below.

The wafer carrier is moved such that the leftmost chip in the uppermost row of chips satisfies a preset-edge-correction-condition, which is located at a chip measurement portion. The leftmost chip is measured. It is then checked if the chip immediately to the right of the measured chip satisfies the preset-edge-correction-condition. If the condition is determined to be satisfied, the wafer carrier is moved, and this second chip is measured. However, if the condition is determined not to be satisfied, the wafer carrier is moved to a position where the rightmost chip of the next lower row of chips which satisfy the preset-edge-correction-condition is located to the measurement position. This rightmost chip is then measured. The above operations are repeated. When there is no chip on semiconductor wafer 1 which satisfies the preset edge-correction condition, the measurement of this wafer is completed.

However, in a probing machine using the above edge-correction technique, a defective chip having almost the same area as that represented by the preset edge-correction condition is undesirably measured as a nondefective chip due to mechanical errors of the machine and measurement errors during positioning. Assume that the edge correction parameter value is given as 100%. A defective chip having an area ratio of about 98% may be undesirably measured. In addition, when defective chips are marked with an ink, some chips each having an area ratio of almost 100% are detected as nondefective chips and not marked with an ink. However, they are always judged as defective chips in subsequent visual checking, thereby adversely affecting the subsequent processes.

In addition, a dummy chip, e.g., a monitoring chip, is also measured. The measuring time per semiconductor wafer is prolonged, and the service life of measuring probes is shortened since unnecessary measurements i.e., measurements of several ten thousands of wafers per day are performed.

In order to solve the above problems, a so-called "probe-area-selection technique" is proposed. According to this technique, as shown in FIG. 3, distances between central point O of semiconductor wafer 1 and chips 4 located in wafer peripheral portions at angles of 0°, 90°, 180°, and 270° are measured, and testing is performed by excluding chips 4 from the beginning.

Even if the probe area selection technique is employed, the edge-correction technique must also be employed in the following case. Chips 5 located in the wafer peripheral portions at angles of 45°, 135°, 225°, and 315° (except 0°, 90°, 180°, 270°) from central point "O" are excluded from the range covered by the probe area selection technique and must be determined by the edge-correction technique. For this reason, a drawback inherent to the edge-correction technique is left unsolved even if the probe area selection technique is employed. Therefore, the above problems cannot be drastically solved.

SUMMARY OF THE INVENTION

It is an object of the present invention to provide a method and apparatus for performing a probing test free from mechanical errors, wherein only chips to be tested can be tested to shorten a test time and prolong the service life of probes, and at the same time, marking errors for defective chips can be eliminated.

It is another object of the present invention to provide a method and apparatus for performing a probing test wherein chips subjected to the test can be clearly distinguished from chips excluded from the test, so that a semiconductor wafer including a dummy chip such as a monitoring chip can be measured within a short period of time.

According to an aspect of the present invention, when a large number of semiconductor device patterns arranged in an object in a matrix form are sequentially tested with probes, an area of at least one of a device pattern subjected to the test and a device pattern excluded from the test is preset, the preset area information is stored, and only the device pattern subjected to the test is tested on the basis of the storage information.

In this case, by using a map generated to distinguish the device pattern subjected to the test from the device pattern excluded from the test on the basis of size information of the object and device patterns, positions of end device patterns of the device patterns arranged in the matrix form may be set, and only the device patterns including the end device patterns and defined between the end device patterns may be tested.

When a device pattern to be excluded from objects to be tested, e.g., a monitoring device pattern, is included in the object and located at an intermediate position in a row, it is preferable to set the position of the monitoring device pattern by using a monitoring TV.

According to another aspect of the present invention, a probing test machine comprises probing means for supplying a test signal to a device pattern circuit to measure its electrical characteristics, area setting means for presetting an area of at least one of a device pattern subjected to a test and a device pattern excluded from the test, preset area storage means for storing preset area information, positioning means for relatively moving the probing means and the device pattern subjected to the test to perform positioning, and control means for controlling an operation of the positioning means on the basis of the storage information stored in the preset area storage means.

BRIEF DESCRIPTION OF THE DRAWINGS

FIG. 8 is a schematic view showing layout of a monitoring chip formed on a semiconductor wafer; and FIG. 9 is a schematic view showing a semiconductor wafer on which a pattern is exposed with a stepper.

DETAILED DESCRIPTION OF THE PREFERRED EMBODIMENT

Various embodiments of the present invention will be described with reference to the accompanying drawings.

A full-automatic wafer probing machine (prober) for testing semiconductor wafers is installed on a floor through damping members. The wafer probing machine includes a cassette table, a wafer conveyor, an loader/unloader, an automatic alignment mechanism, an X-Y-Z-θ drive mechanism, a wafer-setting stage, an inker driver, and a probe card.

The wafer cassette which stores a large number of semiconductor wafers can be loaded in or unloaded from the cassette table of the machine. A semiconductor wafer picked up from the cassette is placed on the wafer carrier through the wafer conveyor, the loader/unloader, and the automatic alignment mechanism. The wafer-setting stage is supported by the X-Y-Z-θ driver having a pulse motor.

Figure 1:
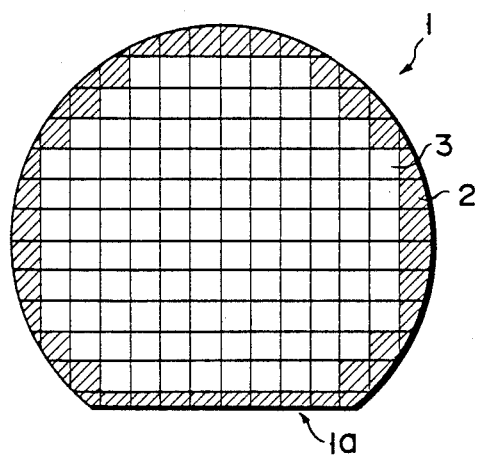
FIG. 1 is a schematic view showing chip layout on a semiconductor wafer.
Figure 2:
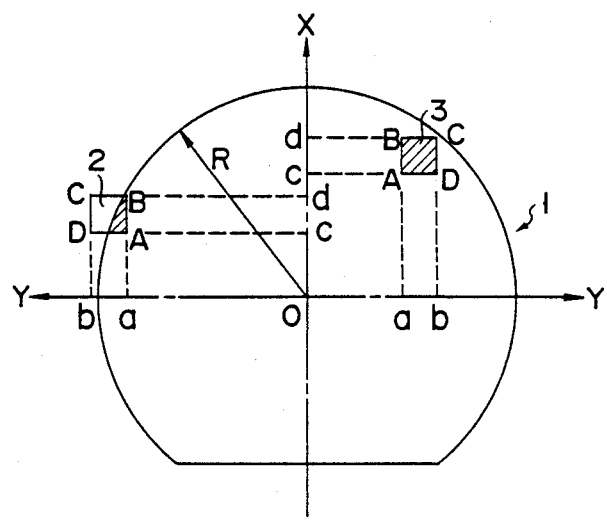
FIG. 2 is a geometric diagram for explaining procedures for obtaining an edge-correction parameter value in a conventional edge-correction technique.
Figure 3:
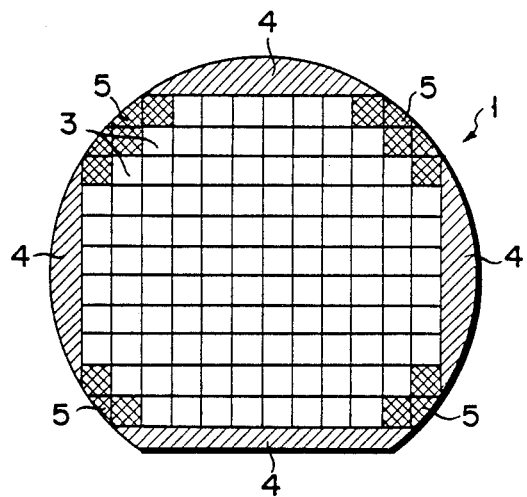
FIG. 3 is a schematic view for explaining a method of setting an area in a conventional probe-area-selection technique.
Figure 4:
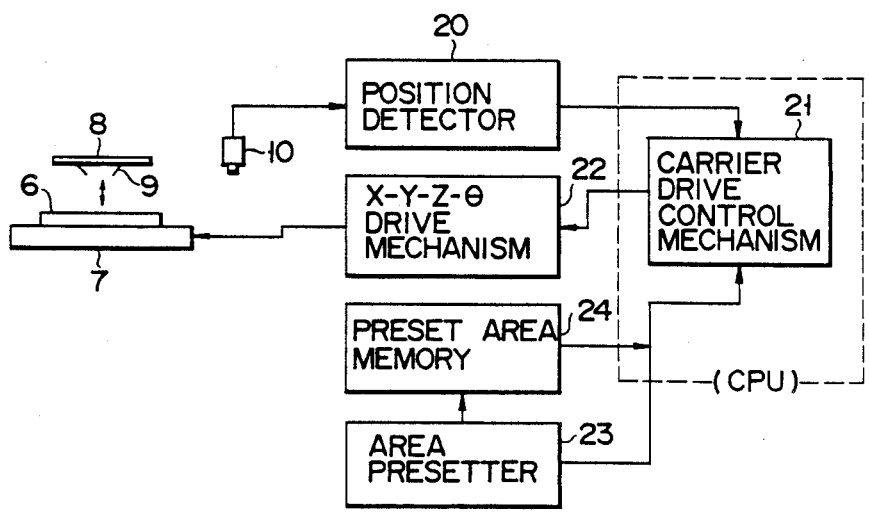
FIG. 4 is a schematic block diagram of a probing test machine according to an embodiment of the present invention.

As shown in FIG. 4, probe card 8 opposes semiconductor wafer 6 on wafer-setting stage 7 during a test. Probe card 8 has a large number of probes 9. Probes 9 are electrically connected to input/output terminals of a tester (not shown) through wires in an insert ring (not shown) and measuring lines.

Capacitive sensor 10 connected to position detector 20 is arranged near wafer-setting stage 7, and the central position and diameter of wafer 6 on stage 7 can be automatically measured. The output terminal of position detector 20 is connected to the input terminal of carrier drive control mechanism 21. The output terminal of carrier drive control mechanism 21 is connected to the input terminal of X-Y-Z-$\theta$ drive mechanism 22. X-Y-Z-$\theta$ drive mechanism 22 moves stage 7 in X-, Y-, Z-, and $\theta$-axes.

Carrier drive control mechanism 21 comprises a microcomputer having a CPU. The input terminal of carrier drive control mechanism 21 is connected to area presetter 23 and preset area memory 24 in addition to position detector 20. The output terminal of area presetter 23 is also connected to the input terminal of preset area memory 24.

An edge-correction parameter of each chip need not be calculated, and an area of a chip of interest is preset to control the operation of X-Y-Z-$\theta$ drive mechanism 22. For example, a measuring area of chips of interest of semiconductor wafer 6 is preset by a disc or key input by area presetter 23. The input data is then supplied to carrier drive control mechanism 21, and only chips having areas within the preset area are tested.

Preset-area-information can be stored in preset area memory 24 in correspondence with types of semiconductor wafers. For this reason, if semiconductor wafers of identical types are to be measured in the next test cycle, for example, only their product numbers are input. In this case, an area need not be updated.

Figure 5:
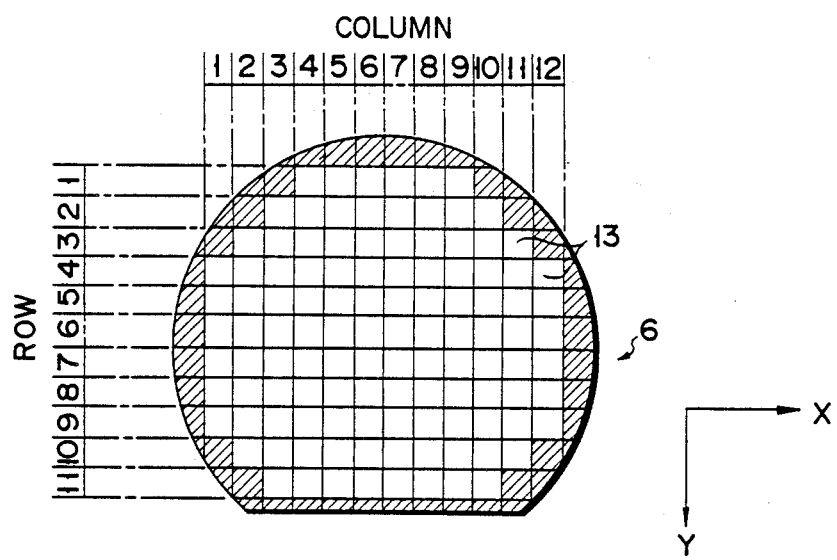
FIG. 5 is a schematic view showing a method of setting an area of a chip to be tested of the semiconductor wafer.

A method of presetting a measuring area will be described with reference to FIG. 5.

An arrangement state of chips 13 of semiconductor wafer 6 is imaged by a television camera and displayed on a predetermined coordinate system on a monitor. In this state, addresses of chips 13 which correspond to column numbers in the X-axis and row numbers in the Y-axis are stored, i.e., registered in a memory while monitoring the display contents. In this case, the row and column numbers represent a type of wafer and a measuring area. This registration operation is performed such that a cursor is displayed on the monitor and stage 7 is moved by a joy stick, thereby setting the addresses.

Predetermined measuring areas are programmed in a memory, e.g., a measuring area input floppy disc in accordance with types of semiconductor wafer and chip. The type of wafer can be automatically recognized by an ID code of each wafer or an ID code marked on each cassette. In the case of semiconductor wafer 6 shown in FIG. 5, column numbers of end chips in measuring areas in units of rows are preset as follows:

4th and 9th columns in 1st row
3rd and 10th columns in 2nd row
2nd and 11th columns in 3rd row
1st and 12th columns in 4th row
. . .
1st and 12th columns in 9th row
2nd and 11th columns in 10th row
3rd and 10th columns in 11th row The above area presetting can be more effectively performed while the screen of the monitor TV is monitored.

Figure 7:
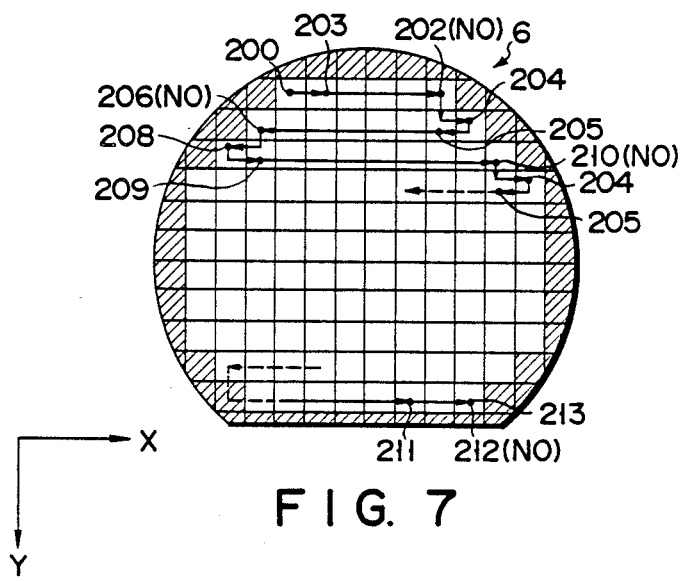
FIG. 7 is a schematic view showing test procedures on the basis of the test flow chart of FIG. 6.
Figure 6:
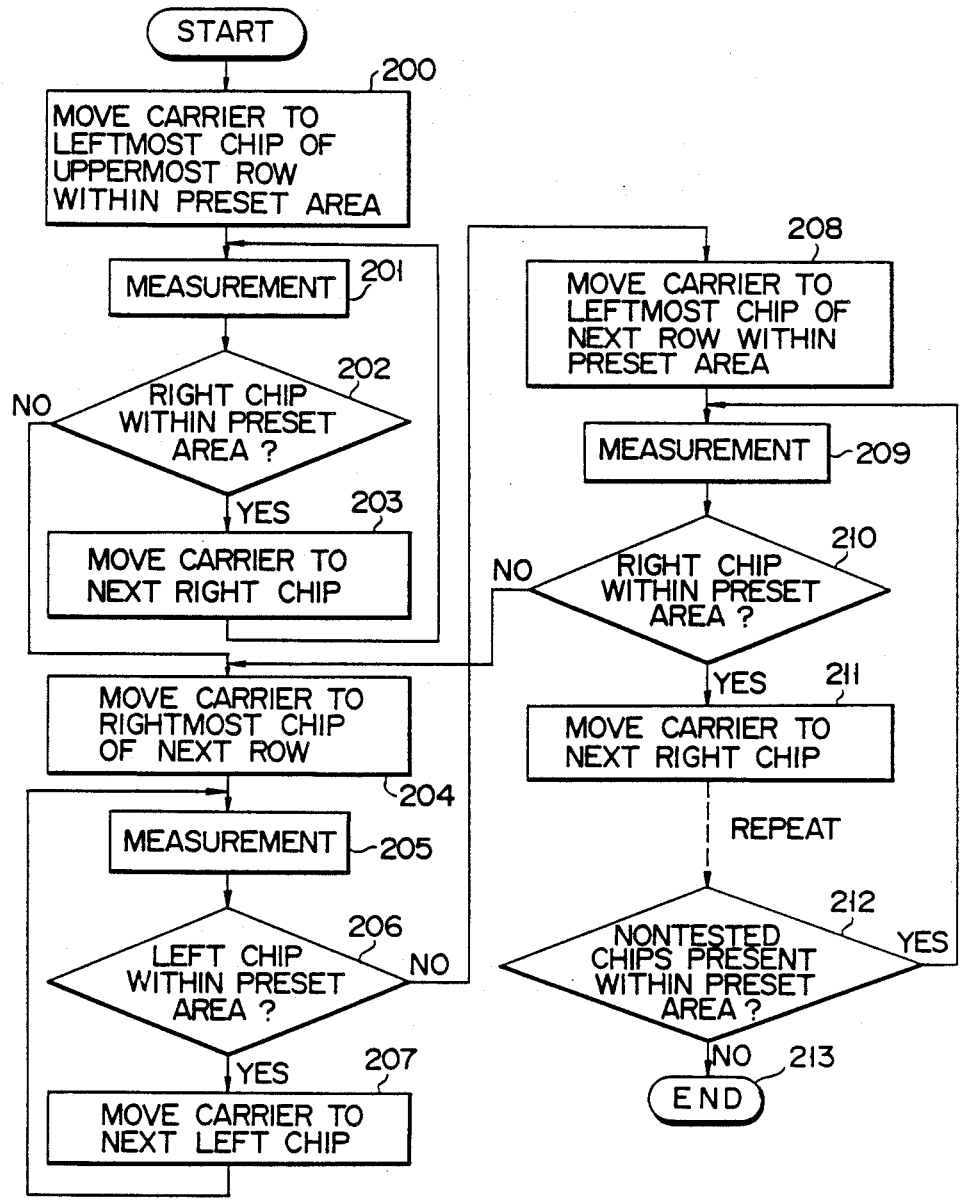
FIG. 6 is a flow chart for explaining a probing test method according to the embodiment of the present invention.

Sequential measurements of chips 13 formed in semiconductor wafer 6 in a matrix form will be described with reference to FIGS. 6 and 7. The same reference numerals throughout FIGS. 6 and 7 denote the same parts.

(I) After the area of the chips to be measured in semiconductor wafer 6 is preset as described above, wafer-setting stage 7 is moved in the X- and Y-axes such that a chip of the first row and fourth column (corresponding to the leftmost chip of the uppermost row in the preset-area) of semiconductor wafer 6 is located immediately below probes 9 of probe card 8 (step 200). Wafer-setting stage 7 is moved upward to bring pads of the chip into contact with probes 9. Predetermined signal currents are supplied from a tester to the chip circuit to measure electrical characteristics of the chip (step 201).

(II) After a measurement of the leftmost chip is completed, it is determined that the chip immediately to the right of the first chip has an area falling within the preset-area (step 202). If this right chip is determined to have an area falling within the preset-area (i.e., if YES in step 202), stage 7 is moved in the X-axis to locate the second chip immediately below probes 9 (step 203). If the right chip is determined not to have an area falling within the preset-area (i.e., if NO in step 202), stage 7 is moved to the position of the rightmost chip of the next line (i.e., second row) within the preset-area (step 204), and this chip is measured (step 205).

(III) It is then checked in step 206 whether the chip immediately to the left of the chip of the immediately preceding measurement cycle has an area falling within the preset-area after the measurement of the chip of the immediately preceding measurement is completed. If this left chip is determined to have an area falling within the preset-area (i.e., if YES in step 206), stage 7 is moved in the X-axis to locate this left chip immediately below probes 9 (step 207). However, if the left chip is determined not to have an area falling within the preset area (i.e., if NO in step 207), stage 7 is moved to the position of the leftmost chip of the next line (third row) within the preset-area (step 208), and this chip is then measured (step 209).

(IV) It is then determined in step 210 whether the chip immediately to the right of the chip of the immediately preceding measurement cycle has an area falling within the preset-area (step 210). If this right chip is determined to have an area falling within the preset-area (i.e., if YES in step 210), stage 7 is moved to the X-axis to locate this right chip immediately under probes 9 (step 211). However, if this right chip is determined not to have an area falling within the preset-area, stage 7 is moved to the rightmost chip of the next line (fourth column) within the preset-area (step 204), and this chip is measured (step 205).

(V) The above operations are repeated, and it is determined whether nonmeasured chips are present within the preset-area (step 212). If it is determined that there is no nonmeasured chips within the preset-area (i.e., if NO in step 212), the measurements are ended (step 213).

In the above embodiment, since the edge-correction technique is not employed, defective chips located in the peripheral portion of the wafer need not be measured. For this reason, a measuring time per semiconductor wafer can be shortened.

In addition, ink marking errors can also be eliminated. An ink marking error occurs in the following case.

Although defective chips having an area ratio almost 100% are tested and are determined to be nondefective chips, these chips may be detected to be defective later on in a visual inspection. For this reason, productivity is degraded by conventional marking errors. To the contrary, according to the present invention, chips subjected to the test are distinguished from chips excluded from the test, and the measuring area is preset. Therefore, the chips excluded from the preset-area are unconditionally marked with an ink. The same efficiency as in a conventional selection post-process for discriminating nondefective chips from defective chips can be obtained in the present invention.

As shown in FIG. 8, monitoring chips 11 may be arranged in some semiconductor wafers to provide wafer process control information. These monitoring chips 11 should be excluded from the test. According to the conventional edge-correction technique, since the area ratio of monitoring chip 11 is given as 100%, it is detected as a chip subjected to the test. For this reason, when monitoring chips are marked as defective chips and are to be measured in the post-process, accurate measurements may not be possible, thus requiring wasteful time in the probing test process.

To the contrary, according to the present invention, monitoring chips 11 are registered as chips excluded from the test at the time of area presetting, and only chips 13 as chips to be manufactured as chip products are measured, passing through monitoring chips 11. In this case, the measurements need not pass through monitoring chips 11 but may be temporarily stopped at monitoring chips 11. Therefore, the measuring time per semiconductor wafer 1 can be shortened, and the service life of the probes can be prolonged.

In addition, as shown in FIG. 9, a technique for printing a device pattern in only an effective area of semiconductor wafer 6 by a stepper is available in recent years. Since the area ratio of each chip 13 obtained by printing the pattern with the stepper is 100%, the edge-correction parameter value need not be calculated.

When probes 9 are brought into contact with wafer peripheral area 12 obtained by printing the pattern with the stepper, physical stress acts on probes 9 and the service life of probes 9 is undesirably shortened. To the contrary, according to this embodiment of the present invention, only chips 13 within the preset-area are measured, and area 12 except for the preset-area is excluded from the area to be measured, thereby effectively preventing the above inconvenience.

When one tester is commonly used for two probing machines, some testers do not allow simultaneous measurements of these two probing machines. In this case, according to the conventional edge-correction technique, during a measurement of wafer peripheral area 12 by one probing machine, the other probing machine must wait even if it is located at a chip having an area ratio of 100%. For this reason, a total measuring time is prolonged, and productivity is degraded. In this case, by employing the method and apparatus of the present invention, a highly efficient probing test can be performed.

In the above embodiment, the area is preset with respect to nondefective chips. However, the area may be preset with respect to defective chips.

According to the present invention as has been described in detail, since only chips subjected to the test can be tested, the measuring time can be shortened, and operation efficiency of the probing machine can be improved. In addition, errors of marking with an ink or the like can be eliminated. In addition, the service life of the probes mounted on the probe card can be substantially prolonged.

Shortening of the measuring time is described below.

Time T to be shortened can be represented by the following equation:

$$T = (t1 + t2 + t3) \times N \qquad (1)$$

where t1 is the measuring time of one chip, t2 is the moving time from the current chip to the next chip, t3 is the marking time of a defective chip with an inker, and N is the total number of defective chips in the peripheral portion and monitoring chips of the semiconductor wafer.

For example, times t1, t2, t3 are 5 sec, 0.3 sec, and 0.03 sec, and N is 40. Therefore, time T to be shortened is 213.2 sec.

What is claimed is:

1. a method of performing a probing test for electrically and sequentially testing a plurality of chips formed in a matrix pattern upon a semiconductor wafer, comprising the steps of:
   (1) storing map information in a storing means, which is an area map distinguishing chip area from nonchip area in accordance with types of the wafer, and includes the address data of monitor chips in the chip area and also the address data of the end chips in a matrix form;
   (2) detecting a central point of the semiconductor wafer to insure the wafer is properly aligned with a probing means;
   (3) reading out the map information from the storing means in accordance with types of the wafer;
   (4) pre-aligning the wafer in an X-Y plane with reference to the probing means on the basis of the map information and the detected central point of the wafer;
   (5) sequentially testing said plurality of chips one by one by starting at one corner of the matrix pattern, and at one end of a first row of chips, and proceeding in a direction across the row; and
   (6) testing a next row of chips by beginning at an opposite end and proceeding in an opposite direction.

2. A method according to claim 1, wherein: said plurality of chips are identical in area and shape.

3. A method according to claim 2, wherein: each of said plurality of chips is a square.

4. A method according to claim 1, wherein: the storing means includes a floppy disc.

5. A method according to claim 1, wherein: the arrangement of chips on the wafer is imaged by a television camera and displayed on a monitor, the storing means giving addresses to the plurality of chips corresponding to column numbers for the X-axis and row numbers for the Y-axis.

6. A method according to claim 1, wherein: the chips subjected to the probing test are printed on the wafer with a stepper.

* * * * *